(12) United States Patent
Park et al.

(10) Patent No.: US 6,984,878 B2
(45) Date of Patent: Jan. 10, 2006

(54) LEADLESS LEADFRAME WITH AN IMPROVED DIE PAD FOR MOLD LOCKING

(75) Inventors: Sang-Bae Park, Kaohsiung (TW);
Yong-Gill Lee, Kaohsiung (TW);
Hyung-Jun Park, Kaohsiung (TW);
Kyung-Soo Rho, Kaohsiung (TW);
Jin-Hee Won, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/851,112

(22) Filed: May 24, 2004

(65) Prior Publication Data

US 2005/0258521 A1    Nov. 24, 2005

(51) Int. Cl.
*H01L 23/495* (2006.01)
(52) U.S. Cl. .................. 257/670; 257/666; 257/674; 257/787
(58) Field of Classification Search ............. 257/670, 257/666, 674, 787
See application file for complete search history.

(56) References Cited

U.S. PATENT DOCUMENTS

| 5,532,905 | A | * | 7/1996 | Moore | 361/723 |
| 6,143,981 | A | | 11/2000 | Glenn | 174/52.4 |
| 6,197,615 | B1 | * | 3/2001 | Song et al. | 438/111 |
| 6,525,406 | B1 | * | 2/2003 | Chung et al. | 257/666 |
| 6,750,545 | B1 | * | 6/2004 | Lee et al. | 257/777 |
| 6,838,751 | B2 | * | 1/2005 | Cheng et al. | 257/666 |
| 2001/0006250 | A1 | * | 7/2001 | Kang et al. | 257/666 |

FOREIGN PATENT DOCUMENTS

| EP | 1 235 272 A1 | * | 1/2002 |
| TW | 531053 | | 5/2003 |

* cited by examiner

*Primary Examiner*—Jasmine Clark
(74) *Attorney, Agent, or Firm*—Troxell Law Office, PLLC

(57) ABSTRACT

A leadless leadframe with an improved die pad for mold locking includes a die pad and a plurality of leads. The leads are arranged around the die pad. A plurality of indentations, such as side semi-vias, are formed on the sidewall of the die pad for filling a package body of the semiconductor package so as to enhance the horizontal mold locking capability of the die pad.

26 Claims, 6 Drawing Sheets

US 6,984,878 B2

LEADLESS LEADFRAME WITH AN IMPROVED DIE PAD FOR MOLD LOCKING

FIELD OF THE INVENTION

The present invention relates to a leadless leadframe for semiconductor packages, and more particularly, to a leadless leadframe with an improved die pad for mold locking.

BACKGROUND OF THE INVENTION

A leadless leadframe can be implemented in semiconductor package with lower cost and smaller dimension. A well-know leadless semiconductor package comprises a semiconductor chip, a leadless metal leadframe for carrying the chip and a package body encapsulating the chip. A plurality of leads of the leadless leadframe has a lower surface exposed out of the bottom of the package body for electrical connection to the outside world. Normally, no outer leads extended from the sidewall of the package body are needed. The leadless semiconductor package is of benefits to smaller dimension, shorter electrical paths, and lower manufacturing cost.

A leadless semiconductor package is disclosed in U.S. Pat. No. 6,143,981. As shown in FIG. 1, the semiconductor package comprises a leadless leadframe 10, a semiconductor chip 20, a plurality of bonding wires 30, and a package body 40. The leadless leadframe 10 comprises a die pad 11 and a plurality of leads 12. The semiconductor chip 20 is attached to an upper surface 11a of the die pad 11. The bonding wires 30 connect bonding pads 21 of the semiconductor chip 20 to the leads 12. The package body 40 encapsulates the semiconductor chip 20. As shown in FIG. 2, it is inevitable that a lower surface 11b of the die pad 11 and the lower surfaces of the leads 12 are exposed out of the bottom surface of the package body 40 for heat dissipation and SMT connection, but leading poor mold locking capability of the die pad 11 and the leads 12 to the package body 40. As shown in FIG. 1, a reentrant portion 13 is formed on the sidewall of the die pad 11 and the leads 12 and is encapsulated by the package body 40 for preventing the die pad 11 peeling off from the package body 40 in vertical direction. However, the reentrant portion 13 is annular design in horizontal direction, therefore, it's unable to enhance the horizontal mold locking of the die pad 11 against the package body 40. Moreover, the coefficients of thermal expansion (CTE) of the die pad 11 and the package body 40 do not match with each other. When the thermal test of the leadless semiconductor package, a horizontal stress is generated between the package body 40 and the die pad 11. The sidewall of the die pad 11 can be delaminated from the package body 40 to slide horizontally. Especially, when the temperature of the leadless semiconductor package is reached up to 260° C. for surface mounting, the sidewall of the die pad 11 will encounter extremely high thermal stress in horizontal direction and then causing delamination from the package body 40.

SUMMARY OF THE INVENTION

A main purpose of the present invention is to provide a leadless leadframe with an improved die pad for mold locking. The leadless leadframe has a plurality of indentations formed on the sidewall of the die pad to be encapsulated the package body to enhance the mold locking capability of the die pad in horizontal direction.

In accordance with the present invention the leadless leadframe with an improved die pad for mold locking mainly comprises a die pad and a plurality of leads. The die pad has an upper surface, a lower surface and a sidewall. A plurality of indentations are formed on the sidewall for filling a package body. The leads are arranged around the die pad. The horizontal mold locking capability of the die pad can be enhanced by the indentations. Preferably, the indentations include side semi-vias.

DETAIL DESCRIPTION OF THE INVENTION

Please refer to the drawings attached, the present invention will be described by means of an embodiment below.

Figure 1:
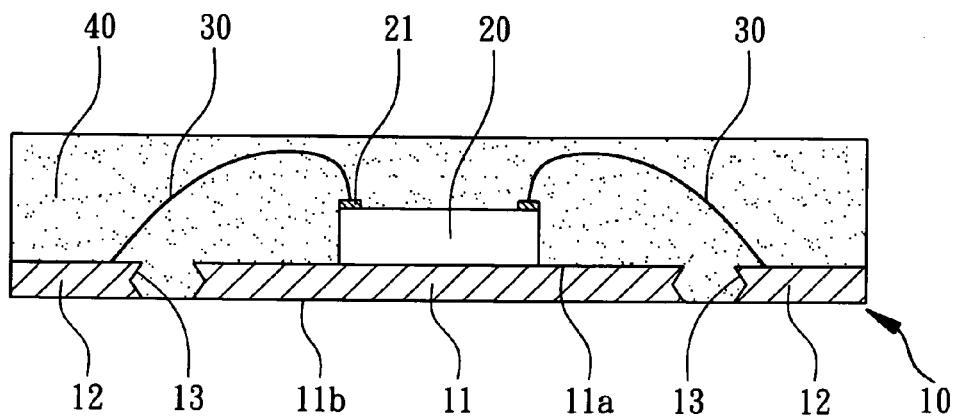
FIG. 1 is a cross-sectional view of a conventional leadless semiconductor package.
Figure 2:
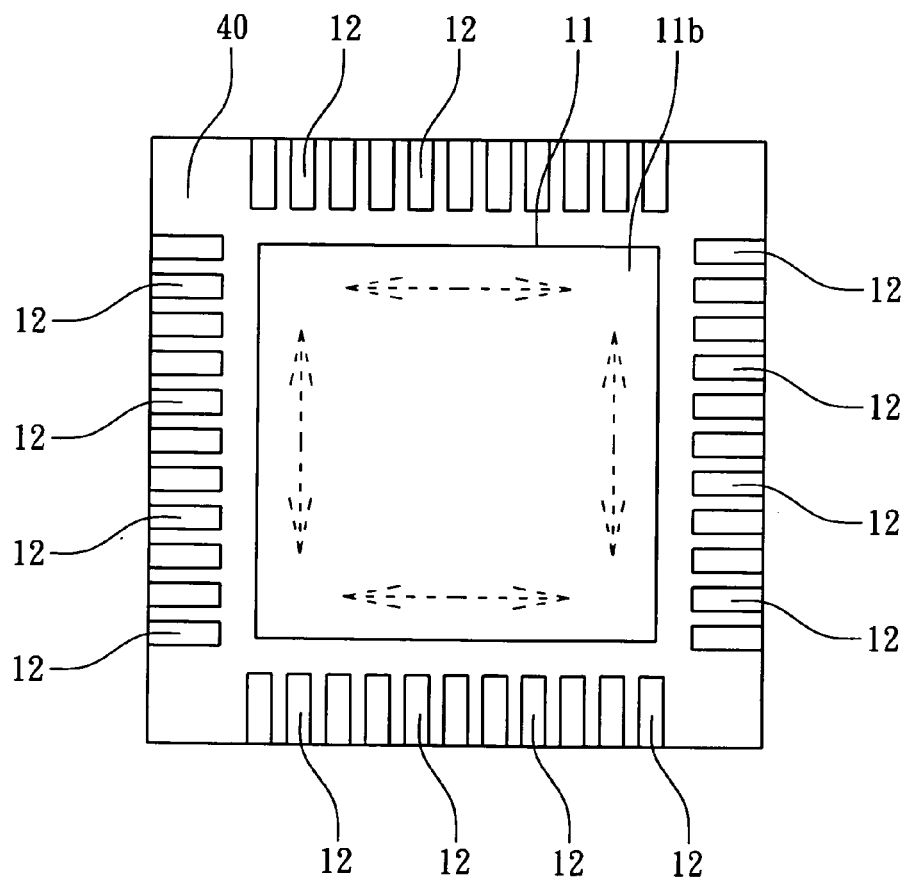
FIG. 2 is a bottom view of the conventional leadless semiconductor package.
Figure 3:
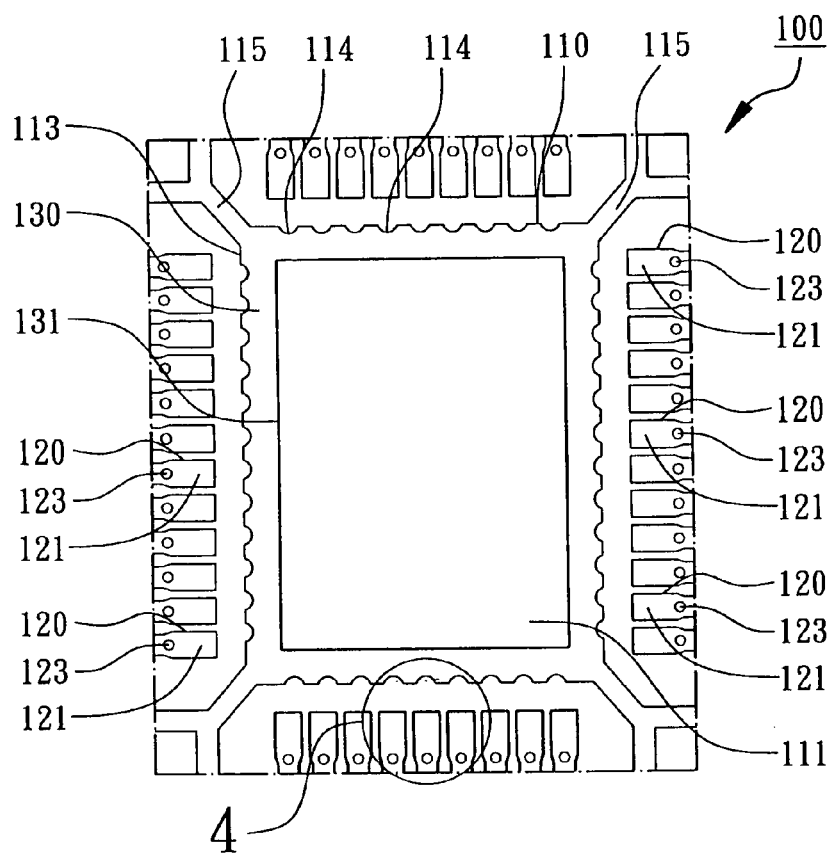
FIG. 3 is a top view of a leadless leadframe with an improved die pad for mold locking according to a first embodiment of the present invention.
Figure 4:
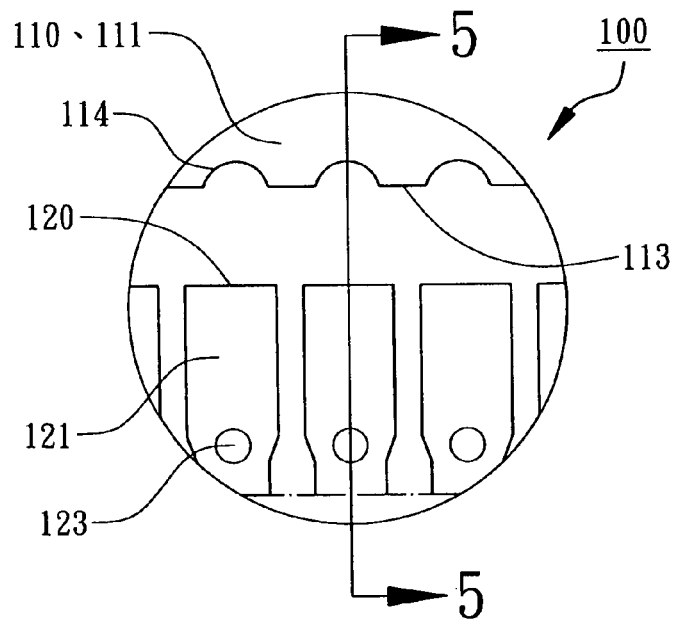
FIG. 4 is a partial top view of the leadless leadframe according to the first embodiment of the present invention.
Figure 5:
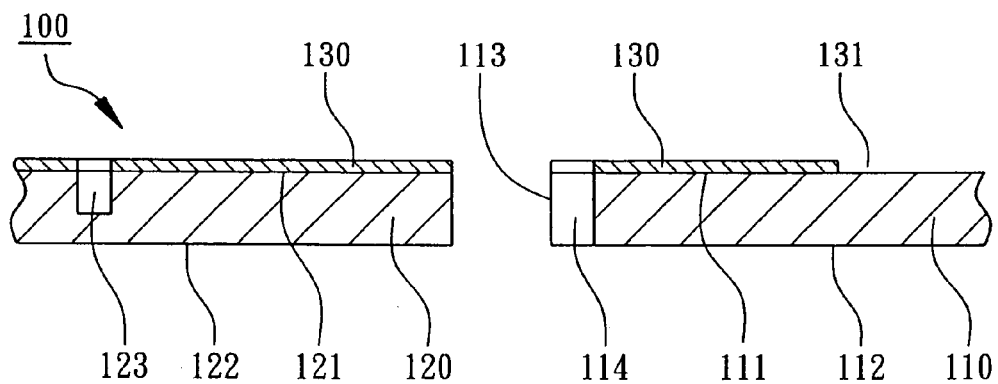
FIG. 5 is a partial cross-sectional view of the leadless leadframe along 5—5 line in FIG. 4 according to the first embodiment of the present invention.
Figure 6:
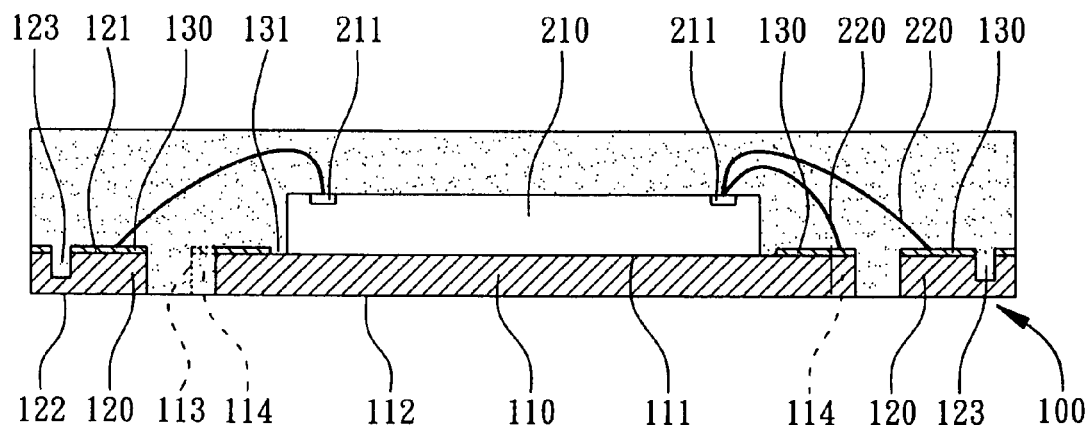
FIG. 6 is a cross-sectional view of the semiconductor package using the leadless leadframe according to the first embodiment of the present invention.

According to a first embodiment of the present invention, a leadless leadframe 100 with an improved die pad for mold locking is shown in FIGS. 3, 4, and 5. The leadframe 100 in each packaging unit comprises a die pad 110 and a plurality of leads 120. The die pad 110 has an upper surface 111, a lower surface 112 and at least a sidewall 113. The sidewall 113 is located between the upper surface 111 and the lower surface 112, as shown in FIG. 5. The sidewall 113 can be vertical or oblique. The height of the sidewall 113 can be equal to or smaller than the thickness of the die pad 110. As shown in FIG. 6, the upper surface 111 of the die pad 110 is configured for attaching a semiconductor chip 210. The lower surface 112 of the die pad 110 is exposed out of the bottom of a package body 230 for enhancing the capability of heat dissipation and providing an electrical connection of ground, as shown in FIG. 6. The die pad 110 is connected to frame of the leadless leadframe 100 via a plurality of tie bars 115. As shown in FIG. 4, a plurality of indentations 114 are formed on the sidewall 113 of the die pad 110. The indentations 114 include side semi-vias which are grooves extending vertically from the periphery of the upper surface 111 for filling a package body 230, as shown in FIG. 6. Preferably, the indentations 114 are arranged in same pitch. In the this embodiment, the indentations 114 include side semi-vias which are in semi-circular shape through the upper surface 111 and the lower surface 112 of the die pad 110. Moreover, the leads 120 are arranged around the die pad 110. By means of the indentations 114, the horizontal mold locking capability of the die pad 110 can be enhanced so that the die pad 110 will not be horizontally delaminated from a package body of a semiconductor package.

Referring to FIGS. 4 and 5, each lead 120 has an upper surface 121 and a lower surface 122. The leads 120 have at least a mold locking blind via 123 on the upper surfaces 121. The mold locking blind via 123 is adjacent to one end of the corresponding lead 120 away from the die pad 110 for enhancing the mold locking capability of the leads 120 during lead-cutting. In the this embodiment, a metal layer 130 made from silver or nickel/gold is plated on the upper surface 111 of the die pad 110 and the upper surfaces 121 of the leads 120 for enhancing the wire-bonding connection of bonding wires 220, as shown in FIG. 6. The metal layer 130 has an opening 131 which exposes the die attach area of the die pad 110 for die attaching the semiconductor chip 210, as shown in FIG. 6.

Figure 7:
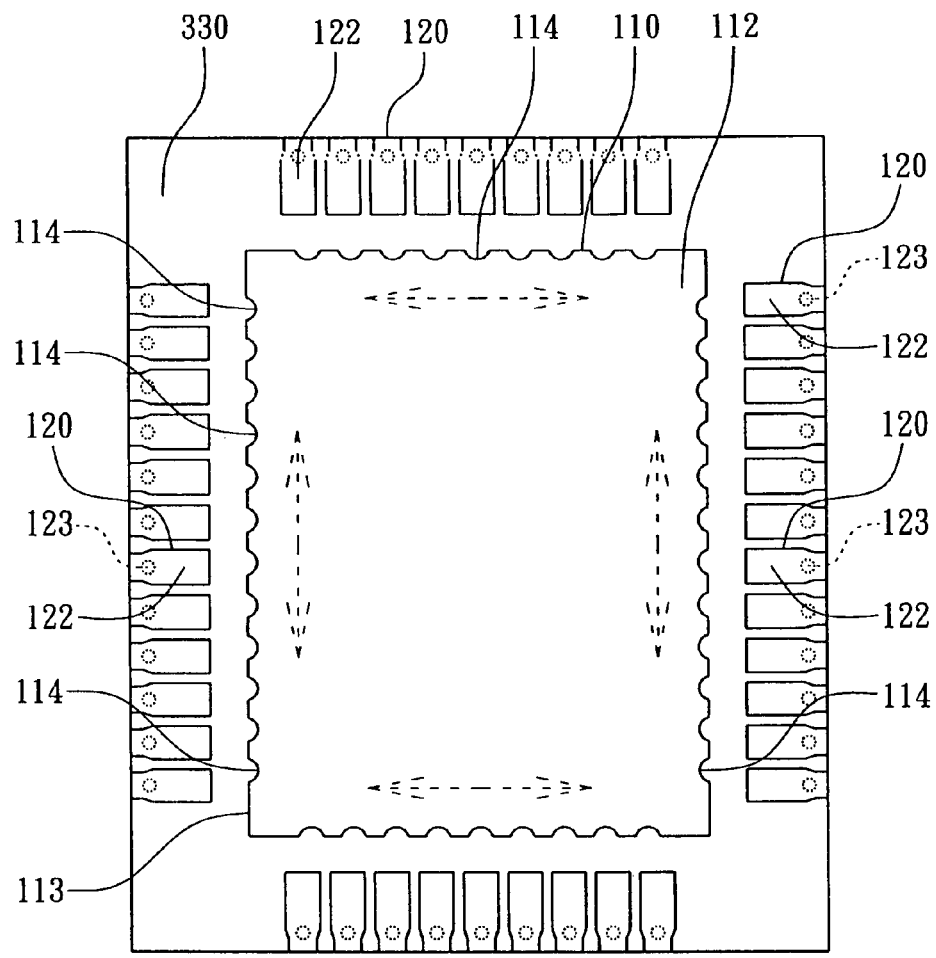
FIG. 7 is a bottom view of the semiconductor package using the leadless leadframe according to the first embodiment of the present invention.
Figure 8:
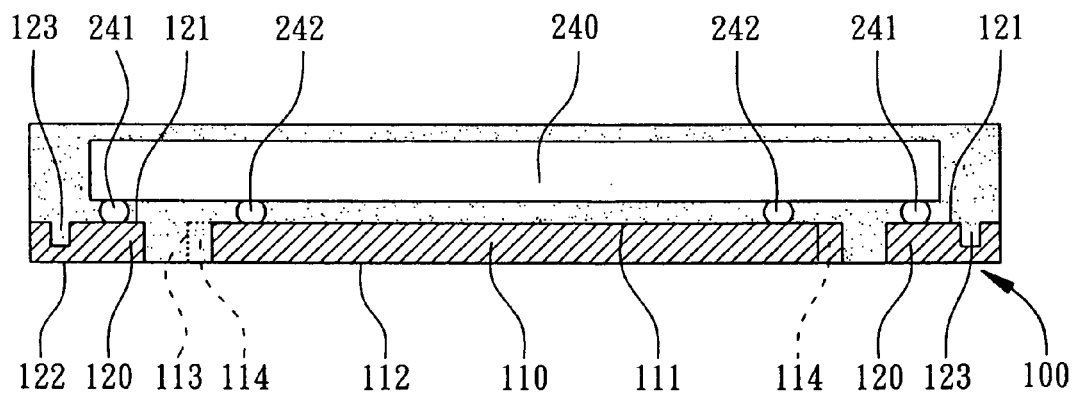
FIG. 8 is a cross-sectional view of the semiconductor package using a leadless leadframe according to a second embodiment of the present invention.

In FIG. 6, when the leadless leadframe 100 mentioned above is implemented in manufacturing a semiconductor package, a semiconductor package comprises the die pad 110 and the leads 120 from the leadless leadframe 100. A semiconductor chip 210 is attached to the upper surface 111 of the die pad 110. A plurality of bonding wires 220 connect bonding pads 211 of the semiconductor chip 210 to the upper surfaces 121 of the leads 120. At least one of the bonding wires 220 connects ground pad of the chip 210 to peripheral portion of the upper surface 111 of the die pad 110 or the tie bar 115 which is plated with the metal layer 130. A package body 230 including electrically insulated resin is formed on the leadless leadframe 100. The package body 230 encapsulates the semiconductor chip 210 and the bonding wires 220, and fills the indentations 114 of the die pad 110 and the mold locking blind holes 123 of the leads 120. As shown in FIG. 7, the lower surface 112 of the die pad 110 and the lower surface 122 of the leads 120 are exposed out of the bottom of the package body 230 for heat dissipation and electrical connection. When the semiconductor package mentioned above passes a thermal test, the indentations 114 can disperse the horizontal thermal stress and firmly hold the side wall 113 of the die pad 110 with the package body 230 in horizontal direction. Therefore, the sidewall 113 of the die pad 110 is not easily to delaminate from the package body 230. Moreover, the mold locking blind holes 123 are able to hold the leads 120 in horizontal direction firmly to avoid any defeats during singulation sawing. Although, in the first embodiment, the chip 210 is electrically connected to the leads 120 through the bonding wires 220. But the leadless leadframe 100 not only can be used for packaging a wire-bonding chip, also can be used for packaging a flip chip. Referring to FIG. 8, a flip chip 240 can be flip-chip mounted to the leadless leadframe 100 in a second embodiment. A plurality of bumps 241 are attached onto the flip chip 240 and are connected to the leads 120. Moreover the flip chip 240 is fixed on the die pad 110 using at least a dummy bump 242, and ground bump, adhesive tape or liquid compound can be an alternative to fix the flip chip 240 on the die pad 110.

Figure 9:
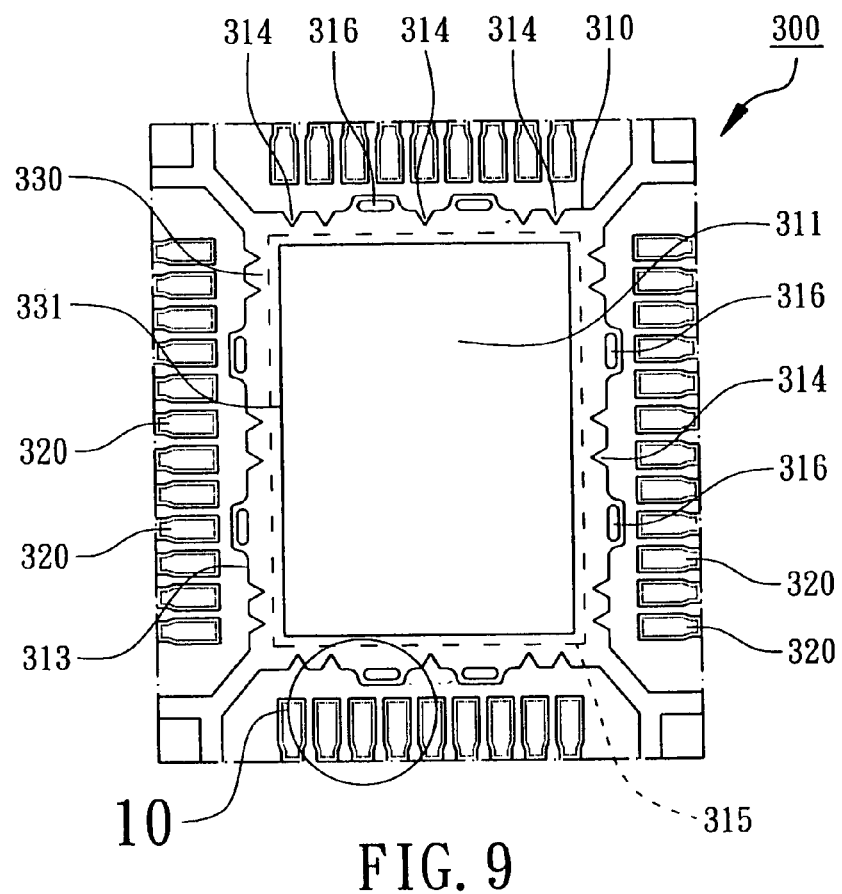
FIG. 9 is a top view of the leadless leadframe according to a third embodiment of the present invention.
Figure 10:
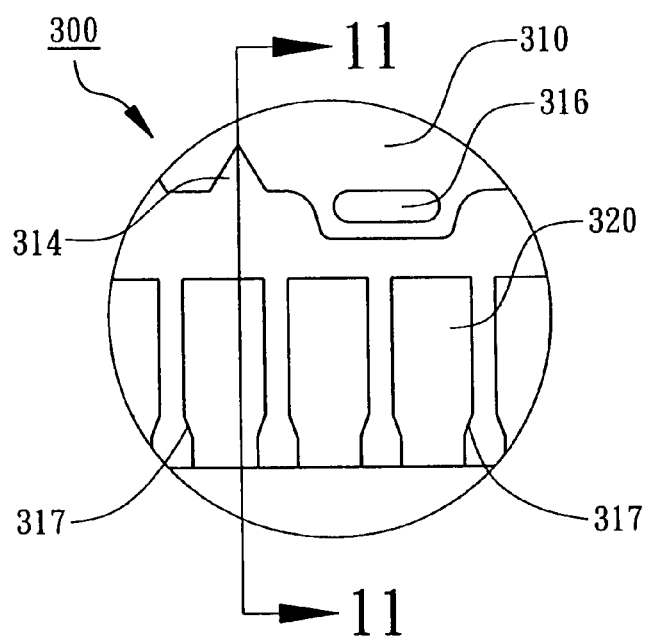
FIG. 10 is a partial top view of the leadless leadframe according to the third embodiment of the present invention.
Figure 11:
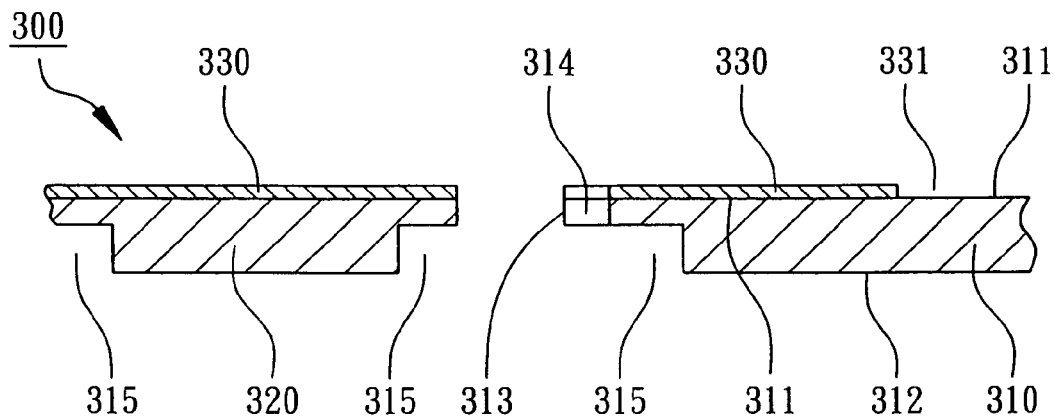
FIG. 11 is a partial cross-sectional view of the leadless leadframe along 11—11 line in FIG. 10 according to the third embodiment of the present invention.

In accordance with a third embodiment of the present invention a leadless leadframe with an improved die pad for mold locking is shown in FIGS. 9, 10 and 11. The leadless leadframe 300 in each packaging unit comprises a die pad 310 and a plurality of leads 320. The die pad 310 has an upper surface 311, a lower surface 312 and a sidewall 313. The leads 320 are arranged around the die pad 310. A plurality of indentations 314 are formed on the sidewall 313 of the die pad 310. The indentations 314 are vertical grooves extending from the periphery of the upper surface 311. In this embodiment, the indentations 314 include side semi-vias which are in V-shape, as shown in FIGS. 9 and 11. A half-etching portion 315 is formed at the periphery of the lower surface 312 of the die pad 310 and the periphery of the lower surface of the leads 320, so that the area of the upper surface 311 is larger than the area of the lower surface 312. Thus the indentations 314 may not extend to the lower surface 312 of the die pad 310. Moreover, the die pad 310 has at least a mold locking through hole 316 which is formed on the upper surface 311 of the die pad 310 corresponding to the half-etching portion 315. The mold locking through hole 316 does not extend to the lower surface 312 of the die pad 310 for filling a package body easily. Therefore, the horizontal mold locking capability of the die pad 310 can be enhanced by means of the indentations 314. In a semiconductor package, a package body can fill the indentations 314 so that the die pad 310 will not easily delaminate from the package body in horizontal direction. Moreover, each leads 320 has a necking portion 317 to connect to frame of the leadless leadframe 300 for singulation sawing.

Figure 12:
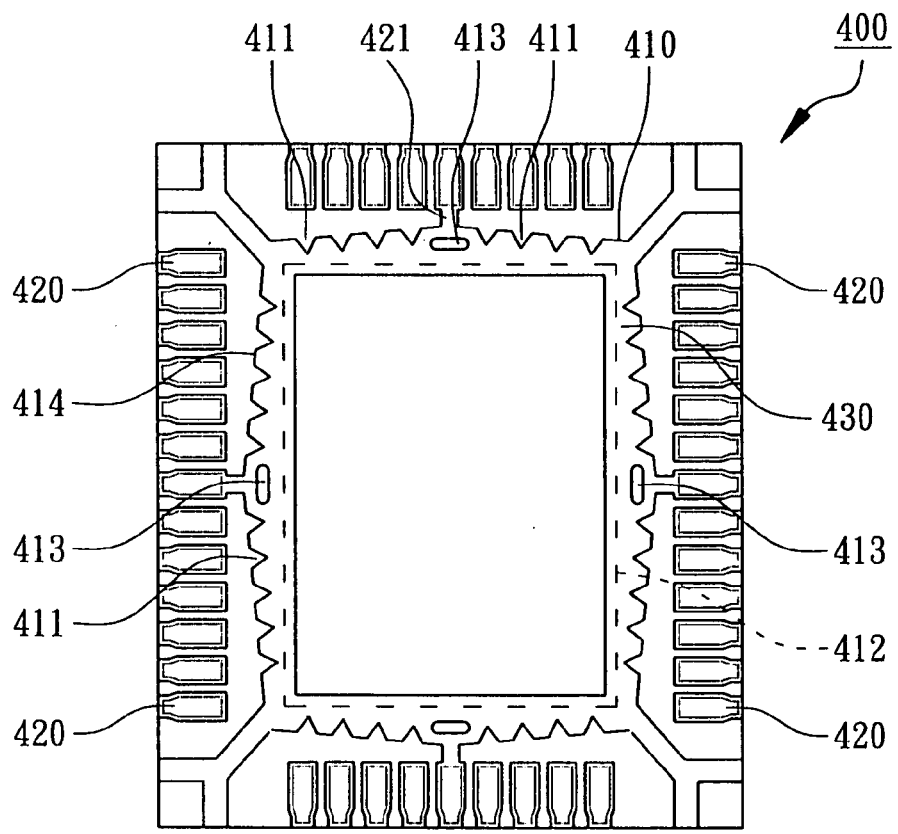
FIG. 12 is a top view of the leadless leadframe with an improved die pad for mold locking according to a fourth embodiment of the present invention.

In accordance with a fourth embodiment of the present invention another leadless leadframe 400 with an improved die pad for mold locking is shown in FIG. 12. The components disclosed in the fourth embodiment are almost the same as those in the third embodiment. The leadless leadframe 400 comprises a die pad 410 and a plurality of leads 420. The leads 420 are arranged around the die pad 410. A plurality of indentations 411 are formed on the sidewall 414 for enhancing the horizontal mold locking capability of the die pad 410 in the leadless semiconductor package. A mold locking through hole 413 is formed on the die pad 410 corresponding to the half-etching portion 412. In this embodiment, the boundary between the upper surface of the die pad 410 and the sidewall 414 are oblique. Preferably, the leads 420 includes an lead 421 that is connected to the die pad 410 for changing the position of the ground terminal of the die pad 410.

The above description of embodiments of this invention is intended to be illustrative and not limiting. Other embodiments of this invention will be obvious to those skilled in the art in view of the above disclosure.

What is claimed is:

1. A leadless leadframe with an improved die pad for mold locking comprising:
    a die pad having an upper surface, a lower surface and a sidewall, wherein a plurality of indentations are formed on the sidewall of the die pad; and
    a plurality of leads arranged around the die pad,
    wherein a metal layer is formed on the upper surface of the die pad and the upper surfaces of the leads.

2. The leadframe of claim 1, wherein the indentations include side semi-vias.

3. The leadframe of claim 2, wherein the side semi-vias are in semi-circular shape.

4. The leadframe of claim 2, wherein the side semi-vias are in V-shape.

5. The leadframe of claim 1, wherein the indentations pass through the upper surface and the lower surface of the die pad.

6. The leadframe of claim 1, wherein at lease one of the leads has a mold locking blind hole on the upper surface thereof.

7. The leadframe of claim 6, wherein the mold locking blind hole is adjacent to one end of the corresponding lead away from the die pad.

8. The leadframe of claim 1, wherein the die pad has a half-etching portion on the periphery of the lower surface so that the area of the upper surface is larger than the area of the lower surface.

9. The leadframe of claim 1, wherein the die pad has a mold locking through hole on its upper surface.

10. The leadframe of claim 1, wherein the sidewall of the die pad is oblique.

11. The leadframe of claim 1, wherein the boundary between the upper surface and the side wall is oblique.

12. The leadframe of claim 1, wherein each lead has a necking portion adjacent to one end thereof away from the die pad.

13. The leadframe of claim 1, wherein at least one of the leads is connected to the die pad.

14. A semiconductor package comprising:
a die pad having an upper surface, a lower surface, and a sidewall, wherein a plurality of indentations are formed on the sidewall of the die pad;
a plurality of leads arranged around the die pad;
a metal layer formed on the upper surface of the die pad and the upper surfaces of the leads;
a semiconductor chip attached to the upper surface of the die pad and electrically connected to the leads; and
a package body encapsulating the chip and the bonding wires, and filling the indentations.

15. The package of claim 14, wherein the lower surface of the die pad is exposed out of the package body.

16. The package of claim 14, wherein the indentations include side semi-vias.

17. The package of claim 14, wherein the indentations pass through the upper surface and the lower surface of the die pad.

18. The package of claim 14, wherein at lease one of the leads has a mold locking blind hole on the upper surface thereof for filling the package body.

19. The package of claim 14, wherein the die pad has a half-etching portion on the periphery of the lower surface so that the area of the upper surface is larger than the area of the lower surface.

20. The package of claim 14, wherein the die pad has a mold locking through hole on its upper surface.

21. The package of claim 14, wherein the sidewall of the die pad is oblique.

22. The package of claim 14, wherein the boundary between the upper surface and the side wall is oblique.

23. The package of claim 14, wherein each lead has a necking portion adjacent to one end thereof away from the die pad.

24. The package of claim 14, wherein at least one of the leads is connected to the die pad.

25. The package of claim 14, further comprising a plurality of bonding wires connecting the chip and the leads.

26. The package of claim 14, further comprising a plurality of bumps attached onto the chip and connected to the leads.

* * * * *